US011201143B2

United States Patent
Tokuyama et al.

(10) Patent No.: US 11,201,143 B2
(45) Date of Patent: Dec. 14, 2021

(54) SEMICONDUCTOR DEVICE WITH A PROTRUDING BASE MEMBER

(71) Applicant: HITACHI AUTOMOTIVE SYSTEMS, LTD., Hitachinaka (JP)

(72) Inventors: Takeshi Tokuyama, Ibaraki (JP); Akira Matsushita, Ibaraki (JP); Tokihito Suwa, Ibaraki (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 531 days.

(21) Appl. No.: 16/089,079

(22) PCT Filed: Jan. 23, 2017

(86) PCT No.: PCT/JP2017/002044
§ 371 (c)(1),
(2) Date: Sep. 27, 2018

(87) PCT Pub. No.: WO2017/168992
PCT Pub. Date: Oct. 5, 2017

(65) Prior Publication Data
US 2020/0303360 A1    Sep. 24, 2020

(30) Foreign Application Priority Data
Mar. 30, 2016  (JP) .............................. JP2016-067036

(51) Int. Cl.
*H01L 25/18* (2006.01)
*H01L 23/492* (2006.01)
*H01L 23/64* (2006.01)

(52) U.S. Cl.
CPC .......... *H01L 25/18* (2013.01); *H01L 23/4922* (2013.01); *H01L 23/642* (2013.01)

(58) Field of Classification Search
CPC .......................... H01L 23/4922; H01L 23/642
See application file for complete search history.

(56) References Cited

U.S. PATENT DOCUMENTS 1,006,880 A1  9/2018  Tsuyuno et al.
2014/0197532 A1  7/2014  Ide et al.
(Continued)

FOREIGN PATENT DOCUMENTS

DE  11 2015 002 954 T5  3/2017
EP      2 725 699 A1   4/2014
(Continued)

OTHER PUBLICATIONS

Office Action dated Mar. 19, 2019 in the corresponding Japanese Patent Application No. 2016-067036 with its English machine translation.

(Continued)

*Primary Examiner* — Tucker J Wright
(74) *Attorney, Agent, or Firm* — Foley & Lardner LLP

(57) ABSTRACT

There is a problem that the reliability of insulation is lowered. A length L2 from a center P of a conductor layer 334 to a peripheral edge portion of an insulating member 333 is formed to be longer than a length L1 from the center P of the conductor layer 334 to a peripheral edge portion of a protruding portion 307a of a base member 307. In other words, a base end surface 308 of the peripheral edge portion of the protruding portion 307a is located on an inner side with respect to an insulating member end surface 336 of the peripheral edge portion of the insulating member 333. Further, the insulating member end surface 336 of the insulating member 333 and a conductor layer end surface 344 of the conductor layer form an end surface at the same position. Since the base end surface 308 of the peripheral edge portion of the protruding portion 307a is located on the inner side with respect to the insulating member end surface 336 of the peripheral edge portion of the insulating member 333 in this manner, an insulation distance can be secured.

5 Claims, 11 Drawing Sheets

(56) References Cited

U.S. PATENT DOCUMENTS

2016/0308523 A1  10/2016  Otake
2018/0211938 A1* 7/2018  Tsuyuno ............. H01L 23/3677

FOREIGN PATENT DOCUMENTS

| JP | 2012-244750 A1 | 12/2012 |
| JP | 2013-118299 A | 6/2013 |
| JP | 2013-229534 A1 | 11/2013 |
| JP | 2013-229535 A1 | 11/2013 |
| JP | 2015-126342 A | 7/2015 |
| WO | WO 2012/120594 A1 | 9/2012 |
| WO | WO-2016-38955 A1 | 3/2016 |

OTHER PUBLICATIONS

Office Action issued in corresponding German Patent Application No. 11 2017 001 071.3 dated Sep. 21, 2020, with English translation.

International Search Report with English translation issued in corresponding application No. PCT/JP2017/002044 dated Apr. 18, 2017.

* cited by examiner

FIG. 11
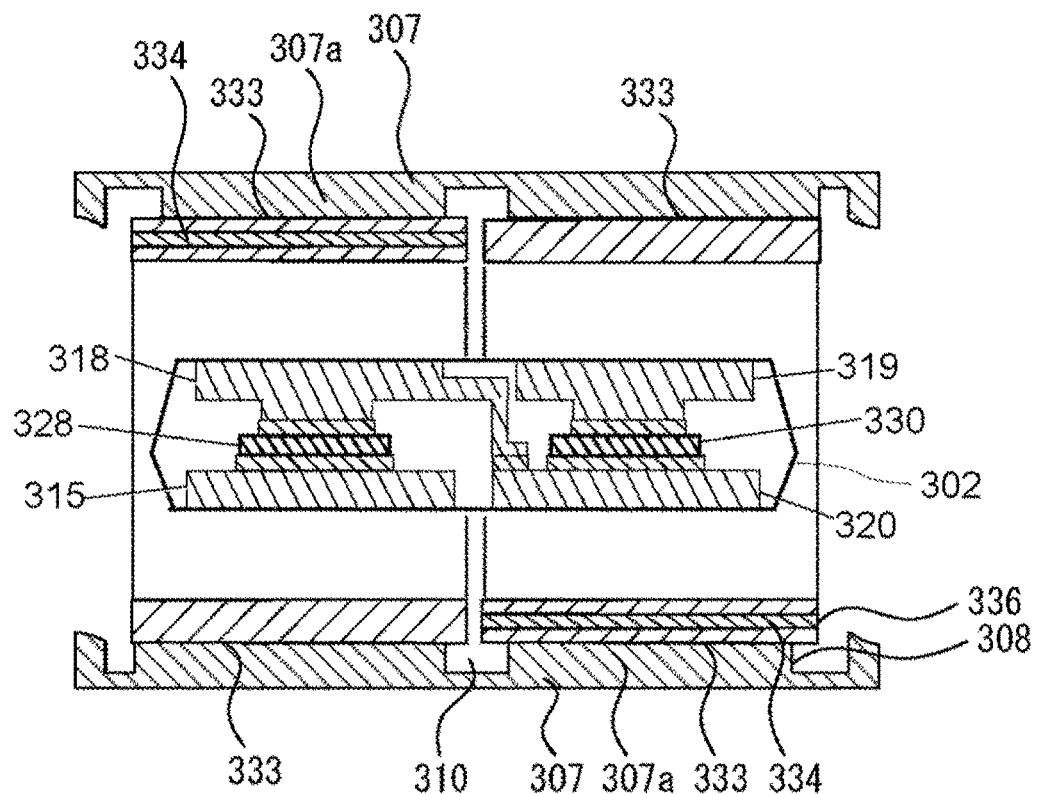
(A)
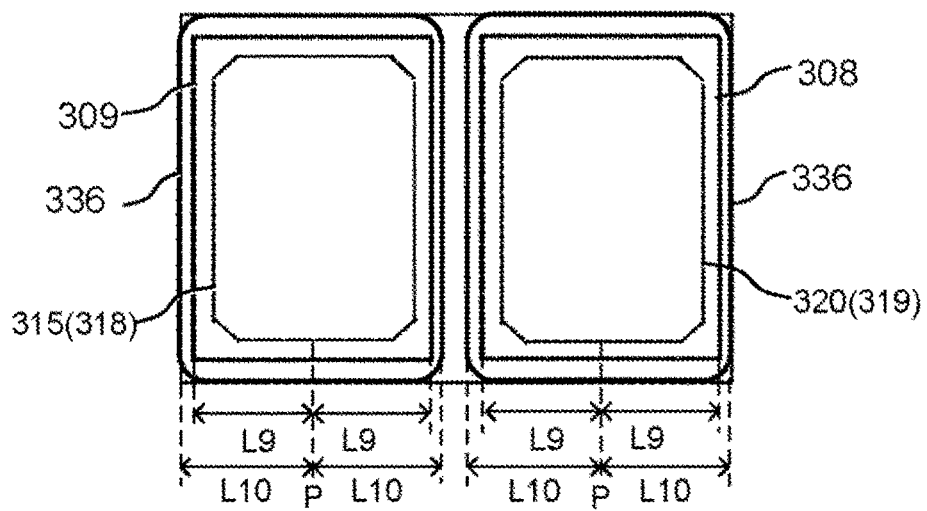
(B)

SEMICONDUCTOR DEVICE WITH A PROTRUDING BASE MEMBER

TECHNICAL FIELD

The present invention relates to a semiconductor device.

BACKGROUND ART

Some semiconductor devices perform a power conversion function to convert direct current power into alternating current power or alternating current power to direct current power.

As such a semiconductor device, PTL 1 discloses an invention of a power conversion device including one or a plurality of semiconductor chips, one or a plurality of conductors connected to the semiconductor chips, a ceramic substrate on which the semiconductor chips and the conductors are mounted, a base plate on which the ceramic substrate is mounted, and a radiator, wherein an insulating plate is sandwiched between the base plate and the radiator and the radiator is grounded to improve dielectric strength. Further, PTL 2 and PTL 3 disclose inventions including a lead frame in which a plurality of semiconductor elements is bonded to one surface, a first insulating layer arranged on the other surface of the lead frame, a metal base plate having one surface to which the lead frame is connected via the first insulating layer, and a second insulating layer arranged on the other surface of the metal base plate to improve insulation properties.

CITATION LIST

Patent Literature

PTL 1: JP 2012-244750 A
PTL 2: JP 2013-229534 A
PTL 3: JP 2013-229535 A

SUMMARY OF INVENTION

Technical Problem

In semiconductor devices described in PTL 2 and PTL 3, the second insulating layer is exposed to the outside of the metal base plate, and thus has a problem of lower reliability of insulation than the first insulating layer due to moisture absorption and thermal stress.

Solution to Problem

A semiconductor device according to the present invention includes a semiconductor element, a conductor plate connected to the semiconductor element, a metal-made base member facing the conductor plate and constituting an exterior of the semiconductor device, and an insulating member arraigned between the conductor plate and the base member, wherein the insulating member is constituted to have a conductor layer sandwiched between a first insulating layer and a second insulating layer, forms a capacitance circuit between the first insulating layer and the conductor plate, and forms a capacitance circuit between the second insulating layer and the base member, the base member has a protruding portion formed in a contact portion between the insulating member and the base member, the protruding portion protruding toward the insulating member, and a length from a center of the conductor layer to a peripheral edge portion of the insulating member including the conductor layer is formed to be longer than a length from the center of the conductor layer to a peripheral edge portion of the protruding portion of the base member.

Advantageous Effects of Invention

According to the present invention, a semiconductor device capable of reliably securing insulation properties can be provided.

BRIEF DESCRIPTION OF DRAWINGS

FIGS. 11(A) and 11(B) are an exploded cross-sectional view and a bottom plan view of a power semiconductor module illustrating a seventh embodiment.

DESCRIPTION OF EMBODIMENTS

First Embodiment

Figure 1:
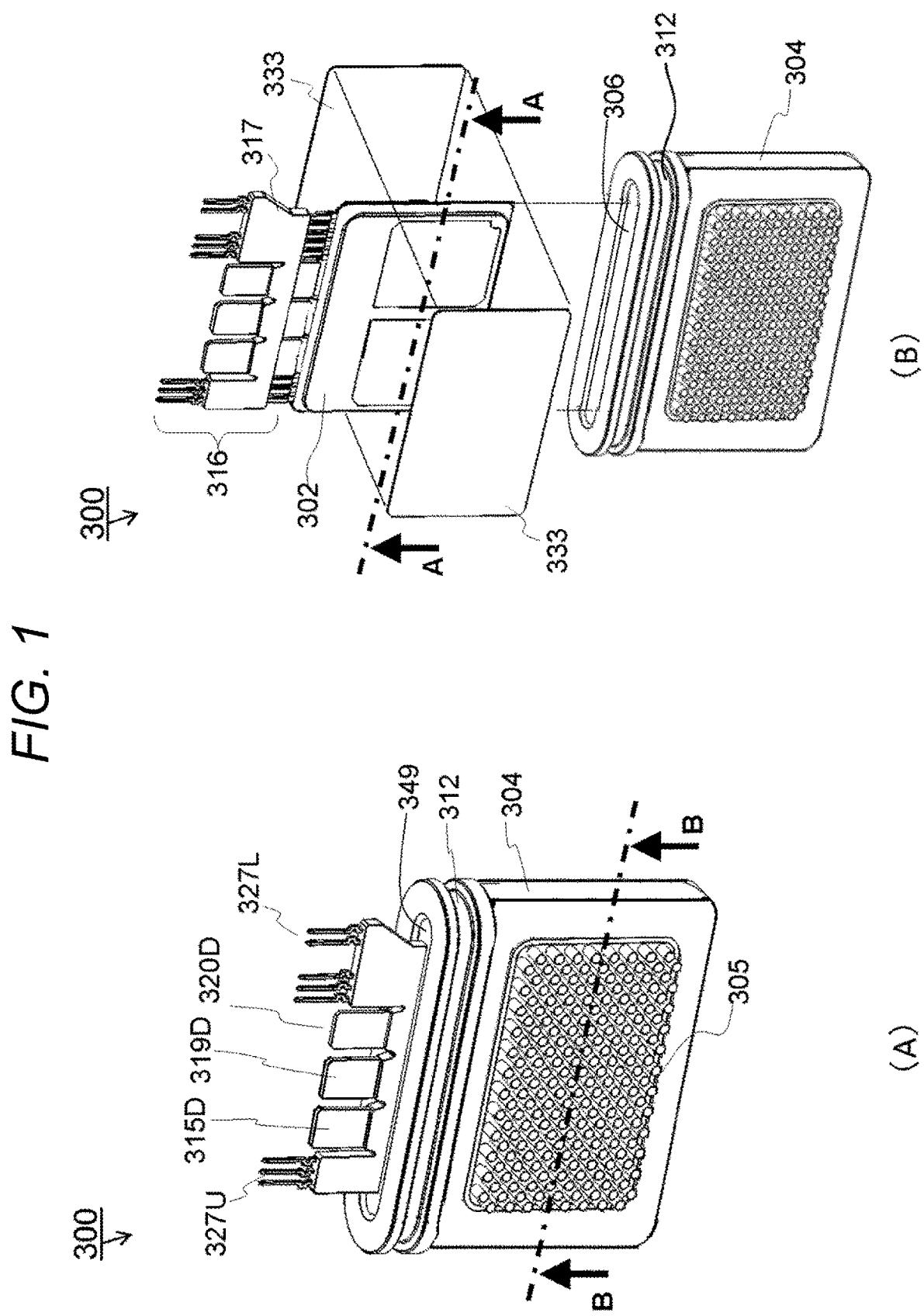
FIGS. 1(A) and 1(B) are an external perspective view and an exploded perspective view of a power semiconductor module.

Hereinafter, an example in which a semiconductor device of the present invention is applied to a power semiconductor module will be described. FIG. 1(A) is a perspective view illustrating an external appearance of a power semiconductor module 300. FIG. 1(B) is an exploded perspective view illustrating a process of assembling the power semiconductor module 300.

As illustrated in FIG. 1(B), a sealing body 302 including a power semiconductor element is sandwiched by insulating members 333 from both sides. Insulation between terminals of wiring led out from the power semiconductor element is secured by a terminal mold material 317, and a terminal mold 316 is formed. A state in which the power semiconductor module 300 is assembled is illustrated in FIG. 1(A). The sealing body 302 and the insulating members 333 are stored in a storage 306 of a case 304 and are sealed by a second sealing resin 349. An O-ring groove 312 is formed in an outer peripheral portion of a storage opening of the storage 306. An O ring is attached to the O-ring groove 312, and the power semiconductor element is fixed to a waterway casing (not illustrated) while compressing the O ring. Fins 305 are provided on both sides of the case 304 and dissipate heat generated by the power semiconductor element. The fin 305 is formed of, for example, a member having electrical conductivity, such as a composite material of Cu, Cu alloy, Cu—C, or Cu—CuO, or a composite material of Al, Al alloy, AlSiC, or Al—C. A power module alternating current terminal 320D for being connected to an alternating current bus bar, a reactor, and the like constituting an inverter circuit (not illustrated), a power module direct current positive terminal 315D for being connected to a capacitor and the like constituting the inverter circuit, and a power module direct current negative terminal 319D protrude from the power semiconductor module 300. Further, an upper arm signal connection terminal 327U and a lower arm signal connection terminal 327L for controlling and protecting the power semiconductor element protrude from the power semiconductor module 300 in the same direction as the power module direct current positive terminal 315D and the power module direct current negative terminal 319D.

Figure 2:
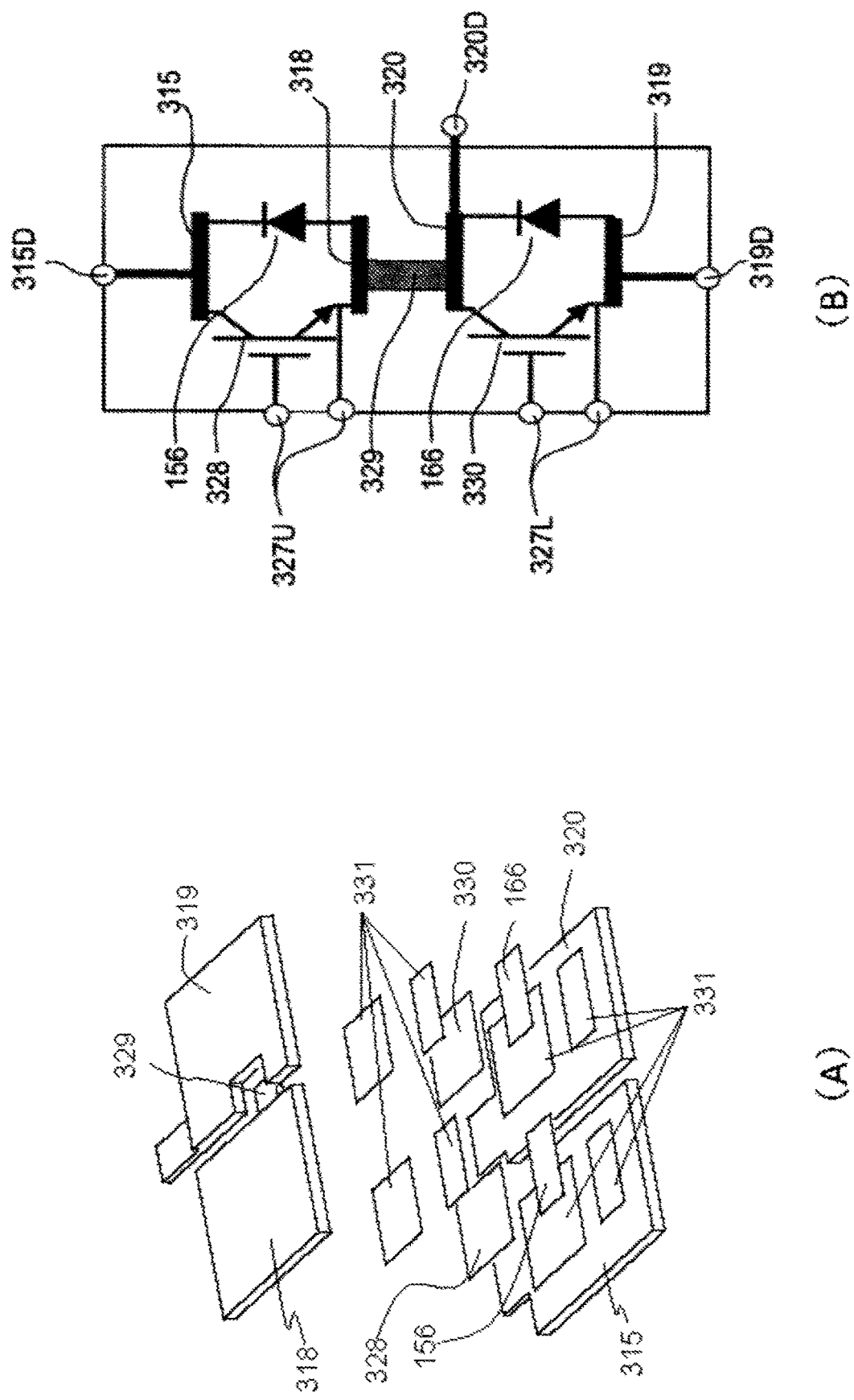
FIGS. 2(A) and 2(B) are an exploded perspective view illustrating a process of assembling internal wiring of the power semiconductor module, and a circuit diagram illustrating an internal circuit.

FIG. 2(A) is an exploded perspective view illustrating a process of assembling internal wiring of the power semiconductor module 300, and is a circuit diagram illustrating an equivalent circuit corresponding to FIG. 2(A). An IGBT 328 and a diode 156 constituting an upper arm circuit that is the power semiconductor element are bonded by metal bonding materials 331 to be sandwiched by upper arm conductor plates 315 and 318, as illustrated in FIG. 2(A). Similarly, an IGBT 330 and a diode 166 constituting a lower arm circuit that is the power semiconductor element are bonded by metal bonding materials 331 to be sandwiched by lower arm conductor plates 319 and 320. The upper arm circuit and the lower arm circuit are bonded at an intermediate connection portion 329 by the metal bonding materials 331 to form an upper and lower arm series circuit.

As illustrated in FIG. 2(B), the upper arm circuit includes the IGBT 328 and the diode 156, and the power module direct current positive terminal 315D is connected to the upper arm conductor plate 315. Further, the lower arm circuit includes the IGBT 330 and the diode 166, and the power module direct current negative terminal 319D is connected to the lower arm conductor plate 319. The upper arm conductor plate 318 and the lower arm conductor plate 320 are connected at the intermediate connection portion 329. Further, the lower arm conductor plate 320 is connected to the power module alternating current terminal 320D. A gate electrode of the IGBT 328 of the upper arm circuit is connected to one of the upper arm signal connection terminals 327U and an emitter electrode of the IGBT 328 of the upper arm circuit is connected to another of the upper arm signal connection terminals 327U. A gate electrode of the IGBT 330 of the lower arm circuit is connected to one of the lower arm signal connection terminals 327L and an emitter electrode of the IGBT 330 of the lower arm circuit is connected to another of the lower arm signal connection terminals 327L. The IGBTs 328 and 330, the diodes 156 and 166, and the conductor plates 315, 318, 319, and 320 are sealed with a sealing resin material to form the sealing body 302 illustrated in FIG. 1(B).

As the sealing resin used for the sealing body 302, a resin based on novolak, polyfunctional, or biphenyl epoxy resin type can be used, for example, and ceramics such as $SiO_2$, $Al_2O_3$, AlN, or BN, a gel, rubber, and the like are contained, and a thermal expansion coefficient is brought to approximate that of the conductor plates 315, 318, 319, and 320. As a result, a difference in the thermal expansion coefficient between the members can be decreased, and thermal stress generated with temperature rise in a use environment is lowered. Therefore, the life of the power semiconductor module 300 can be prolonged.

Figure 3:
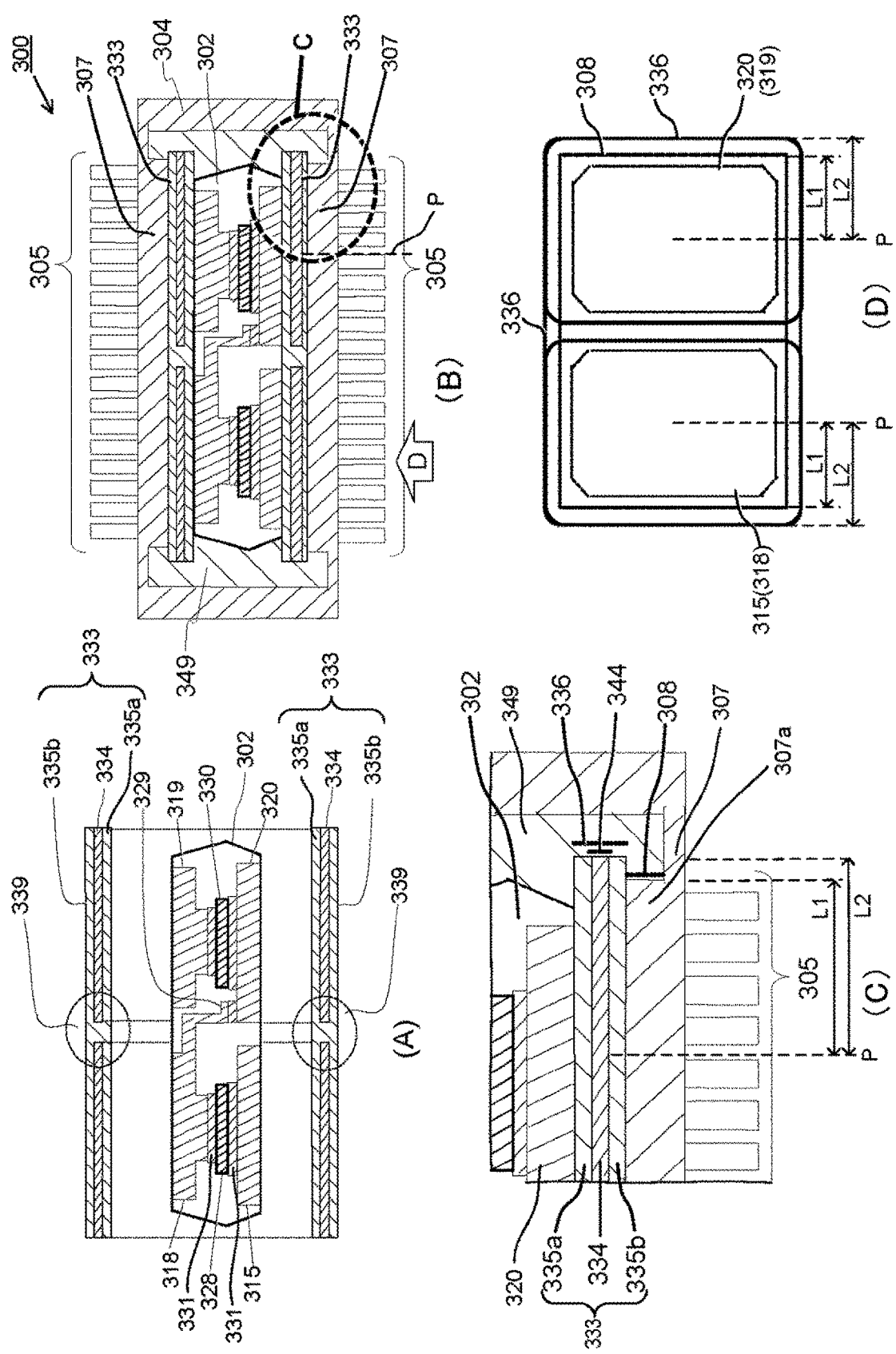
FIGS. 3(A), 3(B), 3(C), and 3(D) are a cross-sectional view illustrating a process of assembling the power semiconductor module, and a cross-sectional view, an enlarged cross-sectional view, and a bottom plan view illustrating an internal structure.

FIG. 3(A) is a cross-sectional view illustrating a process of assembling the power semiconductor module 300, and is a cross-sectional view taken along line A-A in FIG. 1(B). FIG. 3(B) is a cross-sectional view illustrating an internal structure of the power semiconductor module 300, and is a cross-sectional view taken along line B-B in FIG. 1(A). FIG. 3(C) is a cross-sectional view illustrating a detailed structure of the power semiconductor module 300, and is an enlarged cross-sectional view of a C portion in FIG. 3(B). FIG. 3(D) is a plan view of the power semiconductor module 300, and is a bottom plan view as viewed from a D direction in FIG. 3(B).

As illustrated in FIG. 3(A), the IGBTs 328 and 330 are bonded to the conductor plates 315, 318, 319, and 320 via the metal bonding materials 331 to constitute the sealing body 302. The insulating members 333 are provided on an outside of the sealing body 302. The insulating member 333 includes a conductor layer 334 stacked between a first insulating layer 335a and a second insulating layer 335b. The conductor layer 334 illustrated on the lower side in FIG. 3(A) is divided by a slit portion 339 so as to correspond to a gap between the conductor plate 315 and the conductor plate 320. Similarly, the conductor layer 334 illustrated on the upper side in FIG. 3(A) is divided by a slit portion 339 so as to correspond to a gap between the conductor plate 318 and the conductor plate 319.

As illustrated in FIG. 3(B), the sealing body 302 is sealed between base members 307 of the case 304 via the insulating members 333 to constitute the power semiconductor module 300. The case 304 including the base member 307 constitutes an exterior of the power semiconductor module 300 and is made of metal. In this manner, the conductor layers 334 of the insulating members 333 respectively face the conductor plates 315, 318, 319, and 320. Further, a remaining space of the case 304 is filled with the second sealing resin 349 to suppress moisture absorption and thermal stress of the insulating members 333.

As the sealing resin used for the second sealing resin 349, a resin based on novolak, polyfunctional, or biphenyl epoxy resin type can be used, for example, and ceramics such as $SiO_2$, $Al_2O_3$, AlN, or BN, a gel, rubber, and the like are contained, and a thermal expansion coefficient is brought to approximate that of the case 304. As a result, a difference in the thermal expansion coefficient between the members can be decreased, and thermal stress generated with temperature rise in a use environment is lowered. Therefore, the life of the power semiconductor module 300 can be prolonged. As the metal bonding material 331, a soft brazing material (solder) based on an Sn alloy, a hard brazing material such as an Al alloy or a Cu alloy, or a metal sintered material using metal nanoparticles or microparticles is used, for example.

FIG. 3(C) is an enlarged cross-sectional view of the C portion in FIG. 3(B). In the base member 307, a table-shaped protruding portion 307a protruding toward the insulating member 333 is formed in a contact portion between the insulating member 333 and the base member 307. Then, a length L2 from a center P of the conductor layer 334 to a peripheral edge portion of the insulating member 333 is formed to be longer than a length L1 from the center P of the conductor layer 334 to a peripheral edge portion of the protruding portion 307a of the base member 307. In other words, a base end surface 308 of the peripheral edge portion of the protruding portion 307a is located on an inner side with respect to an insulating member end surface 336 of the peripheral edge portion of the insulating member 333. Further, the insulating member end surface 336 of the insulating member 333 and a conductor layer end surface 344 of the conductor layer 334 form an end surface at the same position. Since the base end surface 308 of the peripheral edge portion of the protruding portion 307a is located on the inner side with respect to the insulating member end surface 336 of the peripheral edge portion of the insulating member 333 in this manner, an insulation distance between the conductor layer 334 and the base member 307 is secured. The positional relationship among the base end surface 308, the insulating member end surface 336, the conductor layer end surface 344, and the conductor plates 315, 318, 319, and 320 is illustrated in FIG. 3(D). As illustrated in FIG. 3(D), the base end surface 308 is located on the inner side of the insulating member end surface 336, and the conductor plates 315, 318, 319, and 320 are arranged on the inner side of the conductor layer end surface 344.

Figure 4:
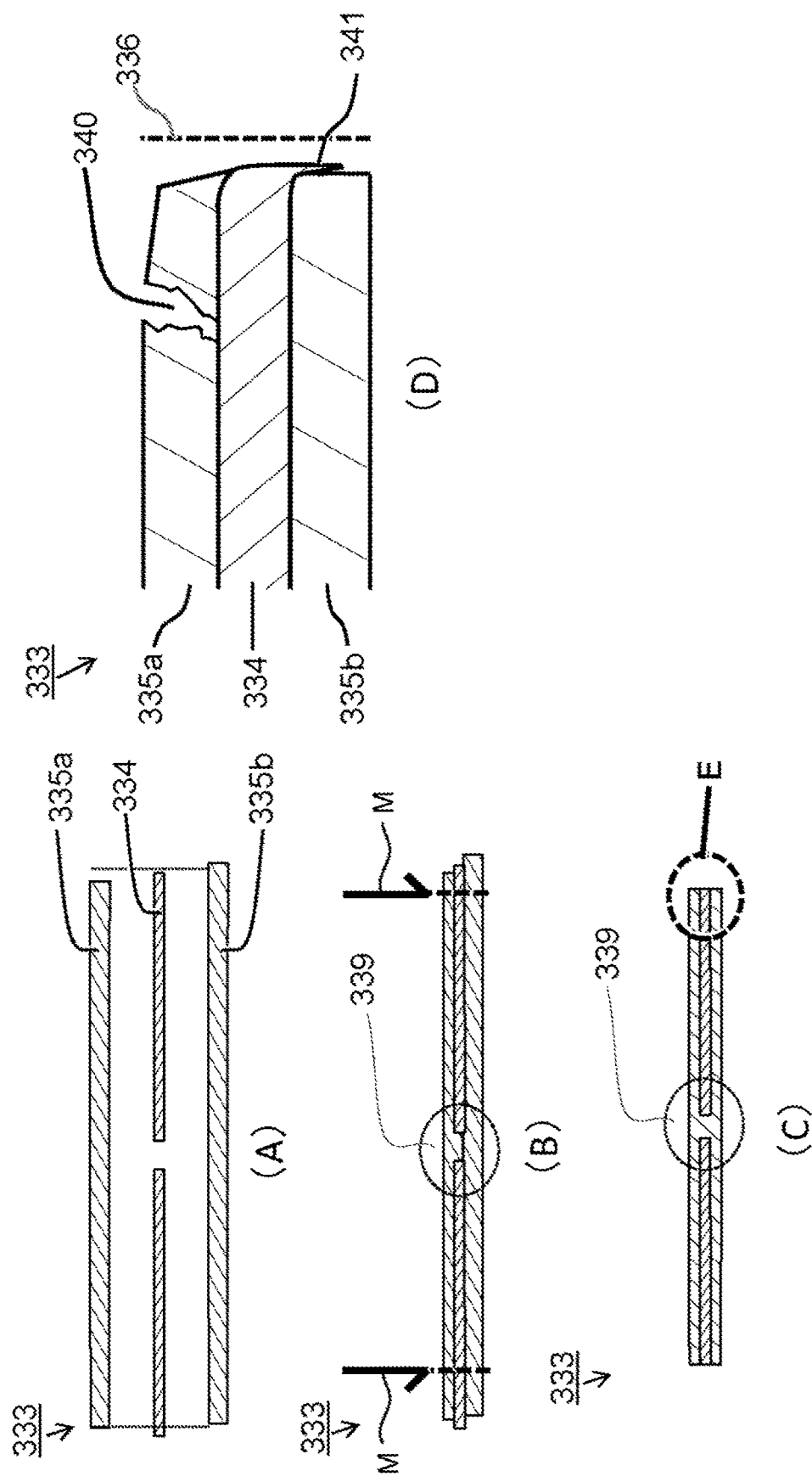
FIGS. 4(A), 4(B), 4(C), and 4(D) are an exploded cross-sectional view for describing a method of pressure-bonding an insulating member, a cross-sectional view for describing a method of forming an outer shape of the insulating member, a cross-sectional view illustrating a structure of the insulating member, and an enlarged cross-sectional view illustrating a detailed structure of the insulating member.

FIG. 4(A) is an exploded cross-sectional view for describing a method of pressure-bonding the insulating member 333. As illustrated in FIG. 4(A), the insulating member 333 is molded by stacking the conductor layer 334 between the first insulating layer 335a and the second insulating layer 335b constituted by an insulating material, and performing thermocompression bonding for the stacked layers in a vacuum state.

After the insulating member 333 is molded by the thermocompression bonding, both ends are cut off with a punching mold N or the like, as illustrated in FIG. 4(B). Note that the conductor layer 334 is divided by the slit portion 339. Then, as illustrated in FIG. 4(C), shapes and dimensions of the insulating member 333 are molded and finished. A detailed enlarged view of a peripheral portion E of the insulating member end surface 336 of the insulating member 333 is illustrated in FIG. 4(D). As illustrated in FIG. 4(D), the insulating member end surface 336 may have a crack 340 and a burr 341 due to cutoff with the punching mold M or the like. In this case, when the conductor layer 334 comes into contact with the base member 307, short-circuit occurs and insulation performance is decreased. However, in the present embodiment, as illustrated in FIG. 3(C), the conductor layer end surface 344 of the conductor layer 334 is arranged on the same plane as the insulating member end surface 336. Then, the base end surface 308 of the peripheral edge portion of the protruding portion 307a is located on the inner side with respect to the insulating member end surface 336 of the peripheral edge portion of the insulating member 333. Therefore, the insulation distance can be secured between the conductor layer 334 and the base member 307, and the insulation performance can be improved.

Figure 5:
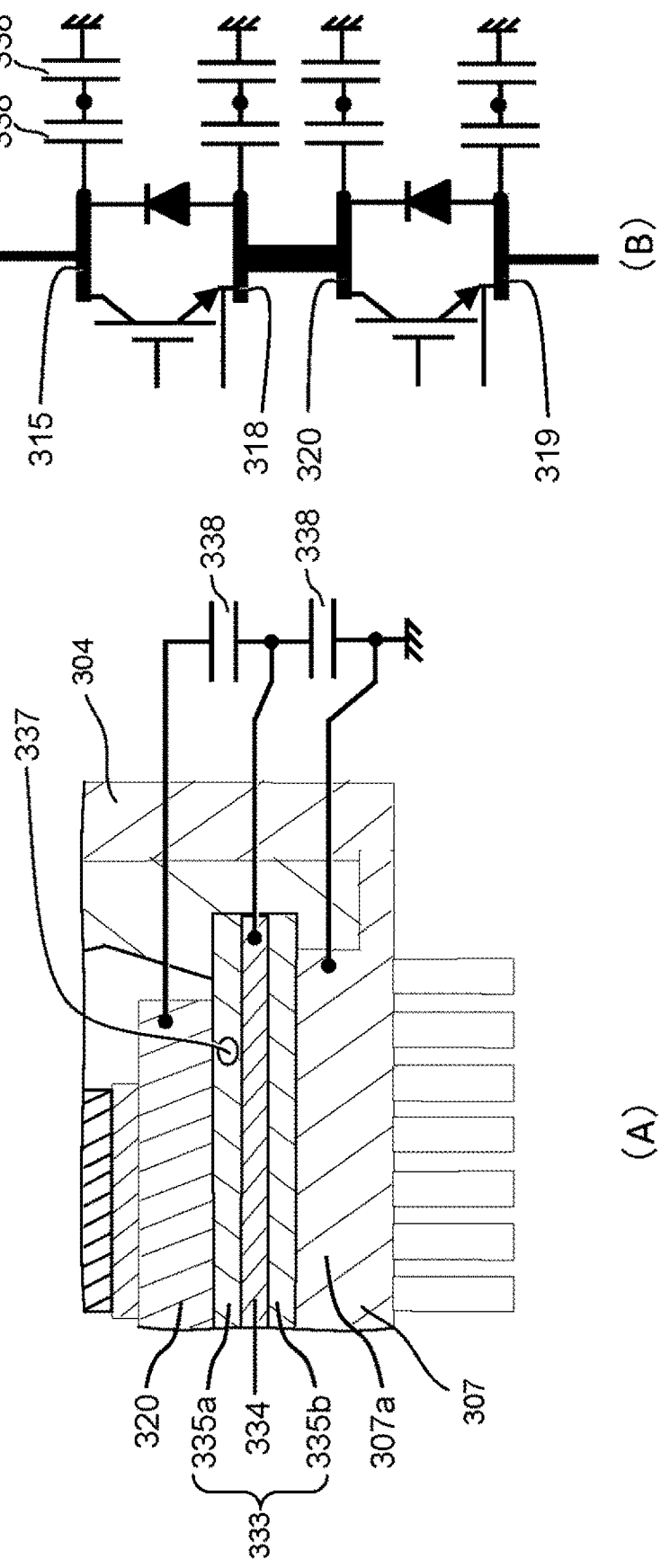
FIGS. 5(A) and 5(B) are a diagram for describing a voltage sharing effect of the power semiconductor module, and a circuit diagram for describing the voltage sharing effect.

FIG. 5(A) is an enlarged cross-sectional view for describing a voltage sharing effect of the power semiconductor module 300. FIG. 5(B) is a circuit diagram for describing the voltage sharing effect of the power semiconductor module 300. At the time of operation of the power semiconductor module 300, a surge voltage at the time of switching operation is applied to a direct current voltage of an inverter system, and a maximum voltage at the time of operation reaches near a withstand voltage of the power semiconductor element. At this time, a value close to this voltage value is applied between the insulating member 333 and the case 304. At this time, the applied voltage is shared by the conductor layer 334, and a voltage applied to the first insulating layer 335a and the second insulating layer 335b can be reduced. For example, in the case where the thicknesses and dielectric constants of the first insulating layer 335a and the second insulating layer 335b on both surface sides of the conductor layer 334 are equal to each other, capacitances 338 of the first insulating layer 335a and the second insulating layer 335b are equal to each other, and the voltage to be applied to the first insulating layer 335a and the second insulating layer 335b can be reduced to half of the voltage to be applied to the insulating member 333. As a result, in the case where a void 337 exists inside the first insulating layer 335a and the second insulating layer 335b, the voltage value applied to the void 337 can also be reduced. Therefore, a discharge voltage of the void 337 is improved and a discharge starting voltage of the insulating member 333 can be improved. When illustrating this state by an equivalent circuit, the equivalent circuit becomes a circuit formed by equivalently connecting the capacitances 338 in series between each of the conductor plates 315, 318, 319, and 320 and a ground potential when the case 304 is at the ground potential, as illustrated in FIG. 5(B).

Second Embodiment

Figure 6:
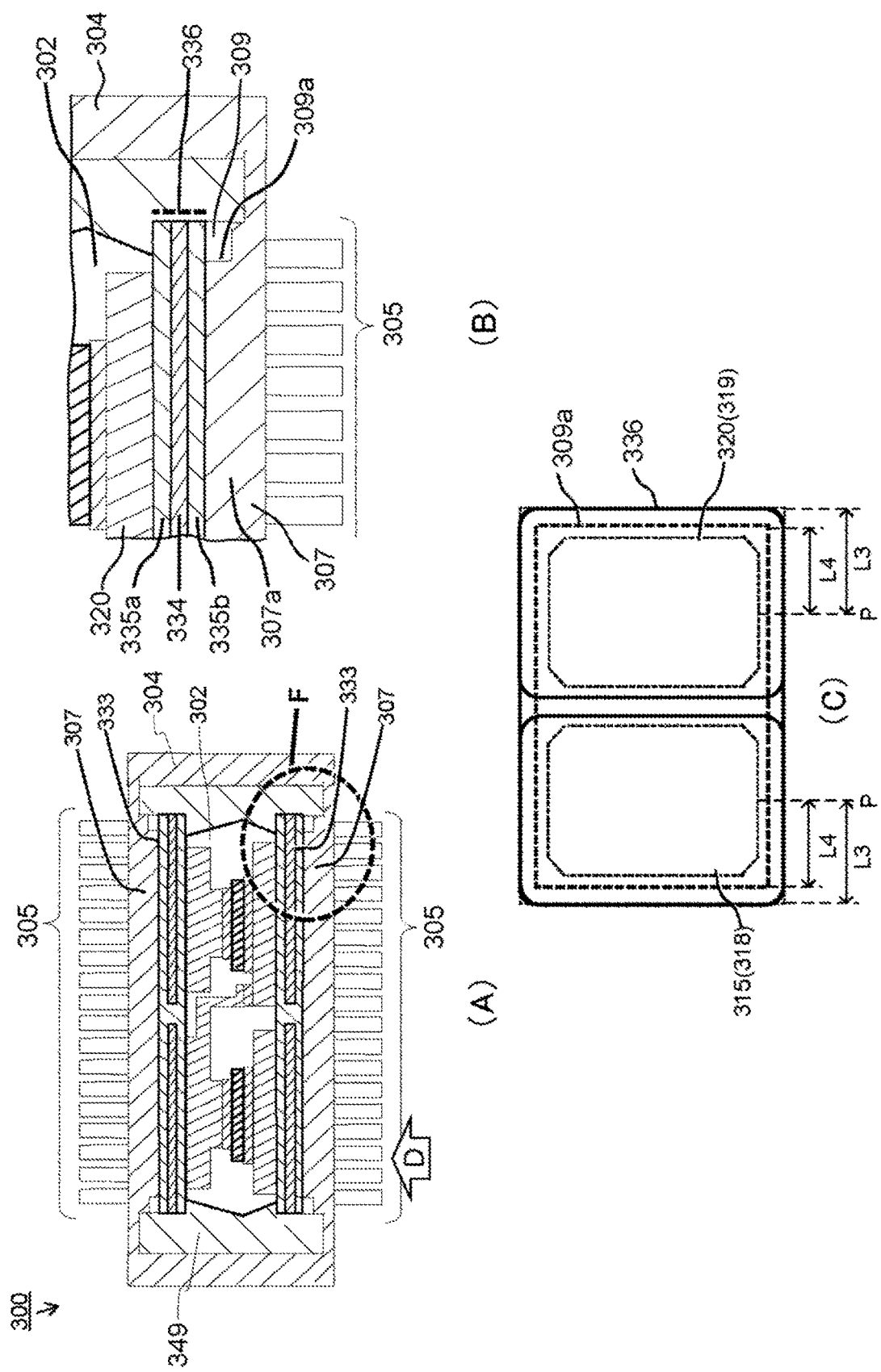
FIGS. 6(A), 6(B), and 6(C) illustrate a second embodiment, and are a cross-sectional view, an enlarged cross-sectional view, and a bottom plan view of a power semiconductor module.

FIGS. 6(A), 6(B) and 6(C) are diagrams illustrating a second embodiment. FIG. 6(A) is a cross-sectional view of the power semiconductor module 300, FIG. 6(B) is an enlarged cross-sectional view of an F portion in FIG. 6(A), and FIG. 6(C) is a bottom plan view of FIG. 6(A) as viewed from a D direction.

In the present embodiment, a base recessed portion 309 is provided in an end surface of a base member 307, as illustrated in FIG. 6(B). This point is different from the first embodiment illustrated in FIG. 3(B), and the other parts have similar configurations. With the base recessed portion 309 provided, a base recessed portion end surface 309a of the base member 307 is located on an inner side with respect to an insulating member end surface 336, as illustrated in FIG. 6(B). In other words, by providing the base recessed portion 309, in the base member 307, a table-shaped protruding portion 307a protruding toward an insulating member 333 is formed in a contact portion between the insulating member 333 and the base member 307.

FIG. 6(C) illustrates positional relationship among the base recessed portion end surface 309a, the insulating member end surface 336, and conductor plates 315, 318, 319, and 320. A length L3 from a center P of a conductor layer 334 to a peripheral edge portion of the insulating member 333 is formed to be longer than a length L4 from the center P of the conductor layer 334 to the base recessed portion end surface 309a of the base member 307, that is, the length L3 is formed to be longer than the length L4 from the center P of the conductor layer 334 to a peripheral edge portion of the protruding portion 307a. In other words, the insulating member end surface 336 and an end surface 344 of the conductor layer are larger in position toward an outside than the base recessed portion end surface 309a, whereby an insulation distance can be secured and insulation performance can be improved. Further, the conductor plates 315, 318, 319, and 320 are arranged on an inner side of the insulating member end surface 336.

Third Embodiment

Figure 7:
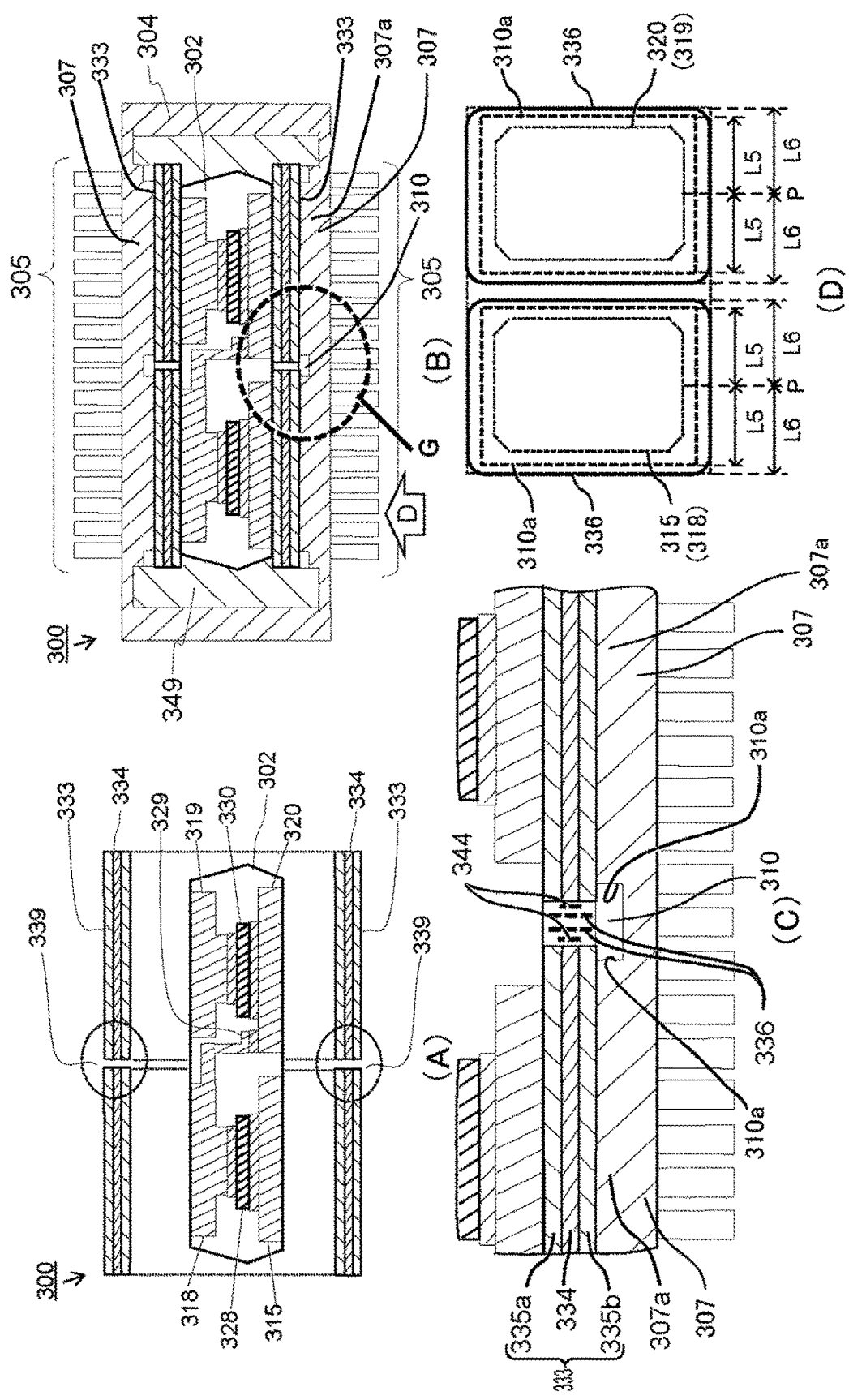
FIGS. 7(A), 7(B), 7(C), and 7(D) illustrate a third embodiment, and are an exploded cross-sectional view, a cross-sectional view, an enlarged cross-sectional view, and a bottom plan view of a power semiconductor module.

FIGS. 7(A), 7(B), 7(C), and 7(D) are diagrams illustrating a third embodiment. FIG. 7(A) is an exploded cross-sectional view of a power semiconductor module 300, FIG. 7(B) is a cross-sectional view of the power semiconductor module 300, FIG. 7(C) is an enlarged cross-sectional view of a G portion in FIG. 7(B), and FIG. 7(D) is a bottom plan view of FIG. 7(B) as viewed from a D direction.

As illustrated in FIGS. 7(A) and 7(B), an insulating member 333 is divided into the same number of insulating members as the number of conductor plates 315, 318, 319, and 320, and the plurality of divided insulating members 333 is arranged respectively facing the plurality of conductor plates 315, 318, 319, and 320. Then, the base member 307 has a recessed portion 310 formed facing a gap position at which the plurality of divided insulating members 333 is adjacent to each other. Other configurations are similar to those in the second embodiment. As illustrated in FIG. 7(C), a conductor layer end surface 344 and an insulating member end surface 336 are on the same plane, and a recessed portion end surface 310a of the recessed portion 310 is locate on an inner side with respect to the insulating member end surface 336 of the insulating member 333. With the recessed portion 310, in the base member 307, two table-shaped protruding portions 307a protruding toward the insulating member 333 are formed in a contact portion between the insulating member 333 and the base member 307.

As illustrated in FIG. 7(D), a length L6 from a center P of a conductor layer 334 to a peripheral edge portion of the insulating member 333 is formed to be longer than a length L5 from the center P of the conductor layer 334 to a peripheral edge portion of the protruding portion 307a of the base member 307. According to the present embodiment, an insulation distance can be secured and insulation performance can be improved, and a slit portion 339 illustrated in FIG. 4(B) becomes unnecessary by the division of the insulating member 333 and a manufacturing process can be simplified.

Fourth Embodiment

Figure 8:
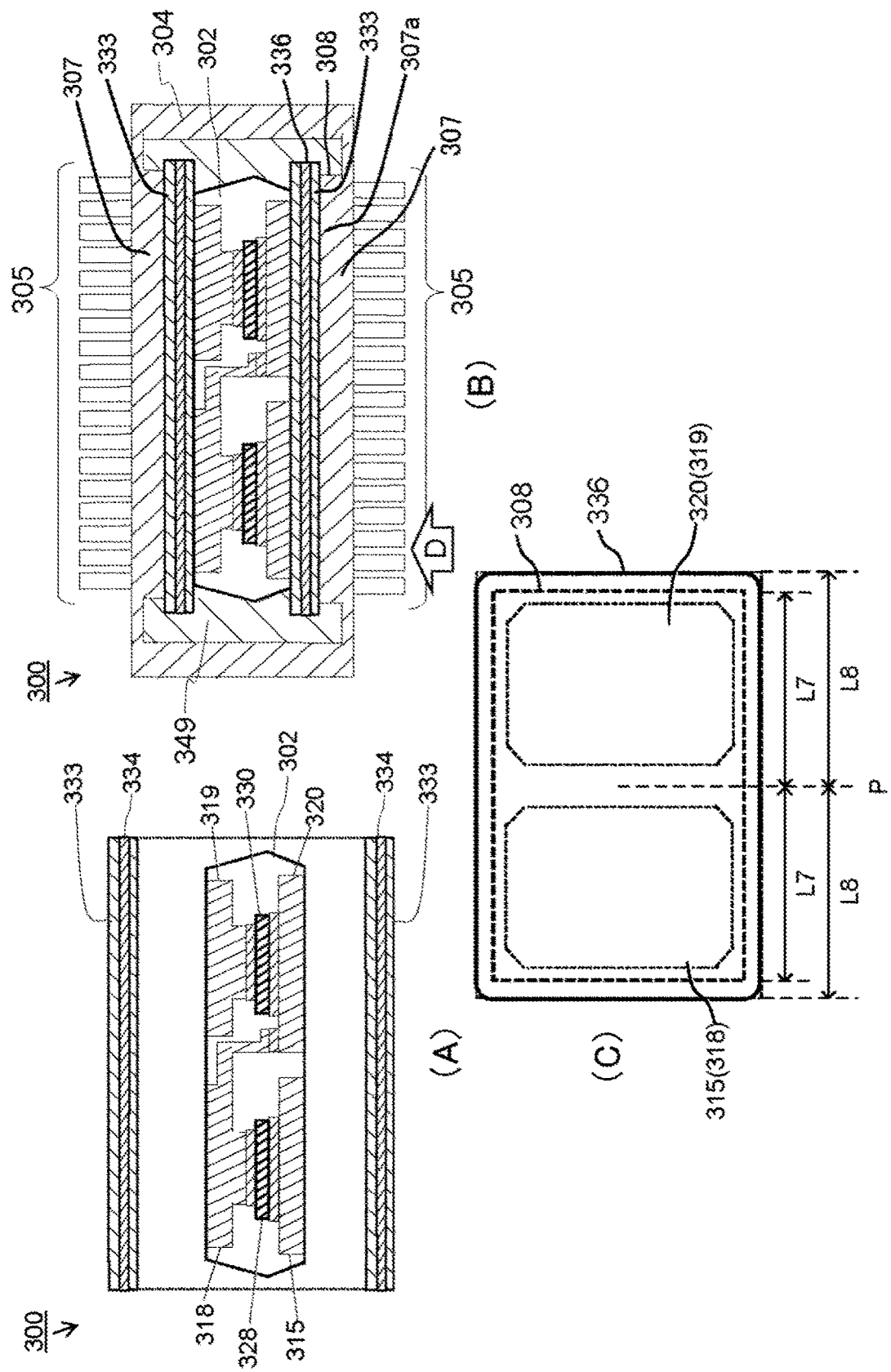
FIGS. 8(A), 8(B), and 8(C) illustrate a fourth embodiment, and are an exploded cross-sectional view, a cross-sectional view, and a bottom plan view of a power semiconductor module.

FIGS. 8(A), 8(B) and 8(C) are diagrams illustrating a fourth embodiment. FIG. 8(A) is an exploded cross-sectional view of a power semiconductor module 300, FIG. 8(B) is a cross-sectional view of the power semiconductor module 300, and FIG. 8(C) is a bottom plan view of FIG. 8(B) as viewed from a D direction.

In the present embodiment, as illustrated in FIG. 8(A), a slit portion 339 illustrated in FIG. 3(A) is not provided a conductor layer 334 of an insulating member 333. This point is different from the first embodiment illustrated in FIG. 3(A), but the other parts have similar configurations. Note that FIG. 8(B) illustrates a case in which the shape of a base member 307 is similar to that of the first embodiment. However, the shape of the base member 307 may have a similar configuration to that of the second embodiment. In the base member 307, a table-shaped protruding portion 307a protruding toward the insulating member 333 is formed in a contact portion between the insulating member 333 and the base member 307. FIG. 8(C) illustrates a positional relationship among an end surface 308 of the protruding portion 307a, an insulating member end surface 336, and conductor plates 315, 318, 319, and 320. A length L8 from a center P of the conductor layer 334 to the insulating member end surface 336, which is a peripheral edge portion of the insulating member 333, is formed to be longer than a length L7 from the center P of the conductor layer 334 to the end surface 308 of the protruding portion 307a, which is a peripheral edge portion of the protruding portion 307a of the base member 307. According to the present embodiment, no slit portion 339 is provided in the conductor layer 334 of the insulating member 333, and thus a manufacturing process can be simplified.

Fifth Embodiment

Figure 9:
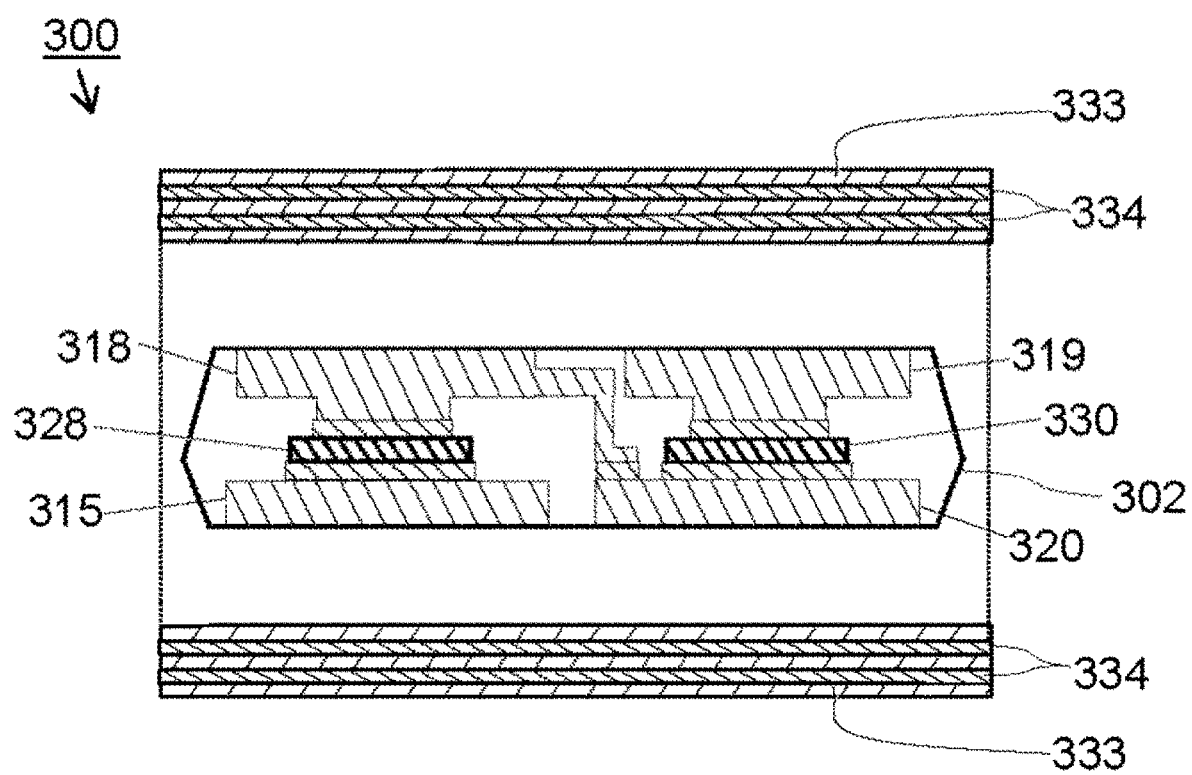
FIG. 9 is an exploded cross-sectional view of a power semiconductor module illustrating a fifth embodiment.

FIG. 9 is an exploded cross-sectional view of a power semiconductor module 300 illustrating a fifth embodiment. As illustrated in FIG. 9(A), a slit portion 339 illustrated in FIG. 3(A) is not provided in a conductor layer 334 of an insulating member 333. Further, two conductor layers 334 of the insulating member 333 are stacked interposing an insulating layer therebetween. The other parts have similar configurations as in the first embodiment. Note that the shape of a base member 307 may be the shape in FIG. 3(B) described in the first embodiment or may be the shape in FIG. 6(A) described in the second embodiment. According to the present embodiment, since the conductor layers 334 are stacked in two layers, insulation performance is further improved and a manufacturing process can be simplified.

Sixth Embodiment

Figure 10:
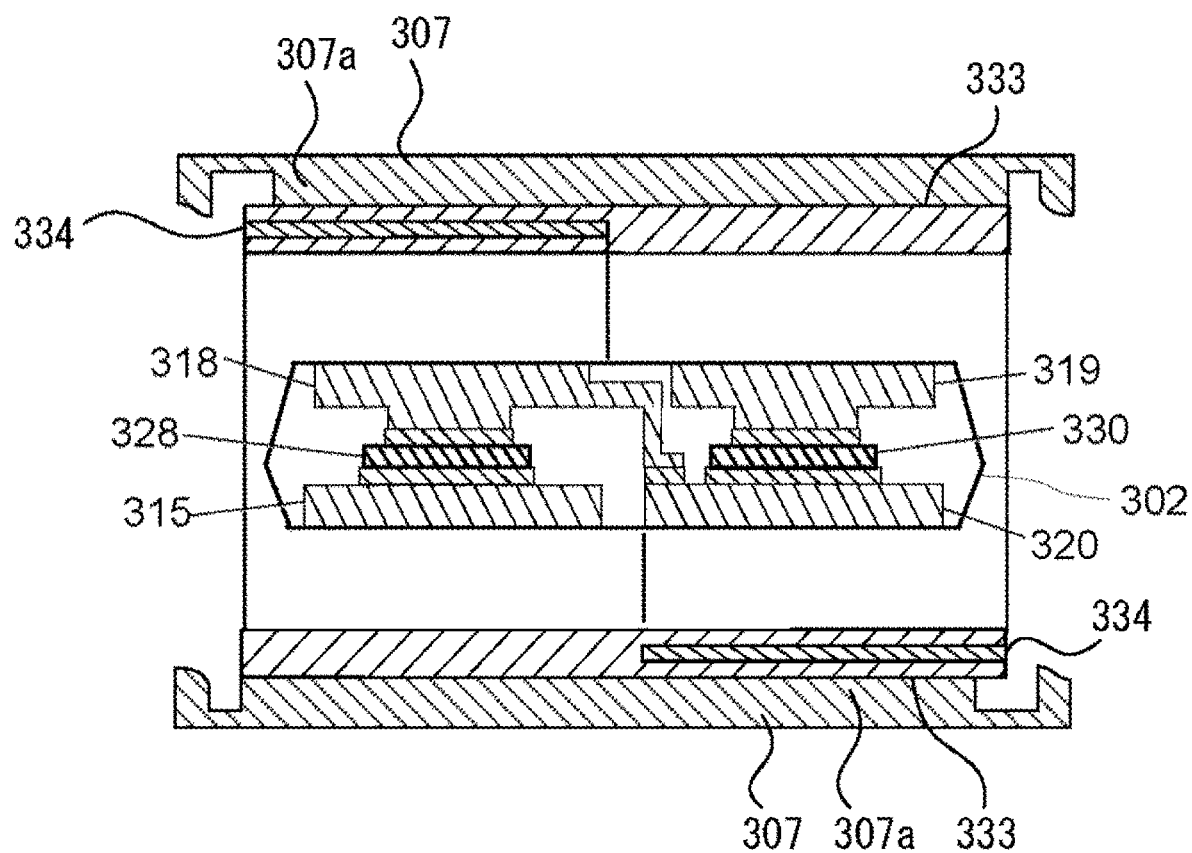
FIG. 10 is an exploded cross-sectional view of a power semiconductor module illustrating a sixth embodiment.

FIG. 10 is an exploded cross-sectional view illustrating a sixth embodiment. As illustrated in FIG. 10, conductor layers 334 of insulating members 333 are provided in portions facing conductor plates 318 and 320 having an alternating current potential and are not provided in portions facing conductor plates 319 and 315. In a base member 307, a table-shaped protruding portion 307a protruding toward the insulating member 333 is formed in a contact portion between the insulating member 333 and the base member 307. Note that the shape of the base member 307 may be the shape illustrated in FIG. 6(A) described in the second embodiment. A relationship between the insulating member 333 facing the conductor plates 318 and 320 having the alternating current potential and the base member 307 is as follows. That is, a length from a center of the conductor layer 334 to a peripheral edge portion of the insulating member 333 is formed to be longer than a length from the center of the conductor layer 334 to a peripheral edge portion of the protruding portion 307a of the base member 307. The other parts have similar configurations as in the first embodiment. According to the present embodiment, since the conductor layer 334 is provided at a location where a withstand voltage is required, insulation performance is improved and a manufacturing process can be simplified.

Seventh Embodiment

FIGS. 11(A) and 11(B) illustrate a power semiconductor module 300 illustrating a structure of a seventh embodiment, and FIG. 11(A) is an exploded cross-sectional view and FIG. 11(B) is a bottom plan view. As illustrated in FIG. 11(A), insulating members 333 are divided and arranged respectively facing conductor plates 315, 318, 319, and 320. Further, conductor layers 334 of the insulating members 333 are provided in portions facing the conductor plates 318 and 320 having an alternating current potential and are not provided in portions facing the conductor plates 319 and 315. The base member 307 is provided with a recessed portion 310 in a central portion of a base member 307. In the base member 307, a table-shaped protruding portion 307a protruding toward the insulating member 333 is formed in a contact portion between the insulating member 333 and the base member 307. Note that the shape of the base member 307 may be the shape illustrated in FIG. 6(A) described in the second embodiment. A relationship between the insulating members 333 facing the conductor plates 318 and 320 having the alternating current potential and the base member 307 is illustrated in FIG. 11(B). That is, a length L10 from a center P of a conductor layer 334 to a peripheral edge portion of the insulating member 333 is formed to be longer than a length L9 from the center of the conductor layer 334 to a peripheral edge portion of the protruding portion 307a of the base member 307. According to the present embodiment, since the conductor layer 334 is provided at a location where a withstand voltage is required, insulation performance is improved and a manufacturing process can be simplified.

According to the above-described embodiments, the following functions and effects can be obtained. (1) The power semiconductor module 300 includes the semiconductor elements (the IGBT 328 and the diode 156), the conductor plates 315, 318, 319, and 320 connected to the semiconductor elements, the metal-made base member 307 facing the conductor plates 315, 318, 319, and 320 and constituting the exterior of the power semiconductor module 300, and the insulating member 333 arranged between the conductor plates 315, 318, 319, and 320 and the base member 307, wherein the insulating member 333 is constituted to have the conductor layer 334 sandwiched between the first insulating layer 335a and the second insulating layer 335b, the capacitance circuit is formed between the first insulating layer 335a and the conductor plates 315, 318, 319, and 320, the capacitance circuit is formed between the second insulating layer 335b and the base member 307, the base member 307 has the table-shaped protruding portion 307a protruding toward the insulating member 333 in the contact portion between the insulating member 333 and the base member 307, and the length from the center of the conductor layer 334 to the peripheral edge portion of the insulating member 333 including the conductor layer 334 is formed to be longer than the center of the conductor layer 334 to the peripheral edge portion of the protruding portion 307a of the base member 307. Thereby, the power semiconductor module 300 capable of reliably securing the insulation properties can be provided.

The present invention is not limited to the above embodiments, and may have a configuration of a combination of the above-described embodiments. Further, other forms considered within the technical idea of the present invention are also included in the scope of the present invention unless characteristics of the present invention are impaired.

REFERENCE SIGNS LIST 300 power semiconductor module
304 case
305 fin
307 base member
307a protruding portion
315, 318, 319, 320 conductor plate
333 insulating member
334 conductor layer
335a first insulating layer
335b second insulating layer

The invention claimed is:

1. A semiconductor device comprising:
   a semiconductor element;
   a conductor plate connected to the semiconductor element;
   a metal-made base member facing the conductor plate and constituting an exterior of the semiconductor device; and
   an insulating member arranged between the conductor plate and the base member, wherein
   the insulating member is constituted to have a conductor layer sandwiched between a first insulating layer and a second insulating layer, forms a capacitance circuit between the first insulating layer and the conductor plate, and forms a capacitance circuit between the second insulating layer and the base member,
   the base member has a protruding portion formed in a contact portion between the insulating member and the base member, the protruding portion protruding toward the insulating member,
   a length from a center of the conductor layer to a peripheral edge portion of the insulating member including the conductor layer is formed to be longer than a length from the center of the conductor layer to a peripheral edge portion of the protruding portion of the base member, and
   a recessed portion is provided in the peripheral edge portion of the protruding portion in the base member, and the length from a center of the conductor layer to the peripheral edge portion of the insulating member including the conductor layer is formed to be longer than a length from the center of the conductor layer to the recessed portion of the base member.

2. The semiconductor device according to claim 1, wherein a plurality of the conductor plates is provided corresponding to a plurality of the semiconductor elements, and a plurality of the conductor layers is provided facing the plurality of conductor plates.

3. The semiconductor device according to claim 2, wherein the insulating member is divided into a same number of the insulating members as a number of the plurality of conductor plates, and a plurality of the divided insulating members is arranged respectively facing the plurality of conductor plates, and
   a recessed portion is formed in the base member, facing a gap position at which the plurality of divided insulating members is adjacent to each other.

4. The semiconductor device according to claim 2, wherein the insulating member is divided into a same number of the insulating members as a number of the plurality of conductor plates, and the plurality of divided insulating members is arranged facing the conductor plates having an alternating current potential, of the plurality of conductor plates, and
   a length to the peripheral edge portion of the insulating member arranged facing the conductor plate having the alternating current potential is formed to be longer than the length to the peripheral edge portion of the protruding portion of the base member.

5. A semiconductor device comprising:
   a semiconductor element;

a conductor plate connected to the semiconductor element;

a metal-made base member facing the conductor plate and constituting an exterior of the semiconductor device; and an insulating member arranged between the conductor plate and the base member, wherein the insulating member is constituted to have a conductor layer sandwiched between a first insulating layer and a second insulating layer, forms a capacitance circuit between the first insulating layer and the conductor plate, and forms a capacitance circuit between the second insulating layer and the base member, the base member has a protruding portion formed in a contact portion between the insulating member and the base member, the protruding portion protruding toward the insulating member, a length from a center of the conductor layer to a peripheral edge portion of the insulating member including the conductor layer is formed to be longer than a length from the center of the conductor layer to a peripheral edge portion of the protruding portion of the base member, and wherein an end surface of the peripheral edge portion of the insulating member and an end surface of the conductor plate are aligned so as to be at a same position in a horizontal direction corresponding to a longitudinal direction of the base member.

* * * * *